(12) United States Patent
Fick et al.

(10) Patent No.: US 10,452,745 B2
(45) Date of Patent: *Oct. 22, 2019

(54) SYSTEMS AND METHODS FOR MAPPING MATRIX CALCULATIONS TO A MATRIX MULTIPLY ACCELERATOR

(71) Applicant: Mythic, Inc., Austin, TX (US)

(72) Inventors: David Fick, Austin, TX (US); Michael Henry, Austin, TX (US); Laura Fick, Austin, TX (US); Malav Parikh, Austin, TX (US); Skylar Skrzyniarz, Austsin, TX (US); Scott Johnson, Austin, TX (US); Pei-Ci Wu, Austin, TX (US); Andrew Morten, Austin, TX (US)

(73) Assignee: Mythic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/392,979

(22) Filed: Apr. 24, 2019

(65) Prior Publication Data

US 2019/0251137 A1 Aug. 15, 2019

Related U.S. Application Data

(63) Continuation of application No. 16/222,277, filed on Dec. 17, 2018.
(Continued)

(51) Int. Cl.
*G06F 17/16* (2006.01)
*G06N 20/00* (2019.01)

(52) U.S. Cl.
CPC .............. *G06F 17/16* (2013.01); *G06N 20/00* (2019.01)

(58) Field of Classification Search
CPC ........ G06F 17/16; G06F 17/17; G06F 17/175; G06N 20/00–20; G06N 3/04; G06N 3/063; G06N 3/065
See application file for complete search history.

(56) References Cited

U.S. PATENT DOCUMENTS 10,169,296 B2    1/2019  Korthikanti et al.
2012/0124333 A1  5/2012  Master et al.
(Continued)

OTHER PUBLICATIONS

"International Search Report and the Written Opinion of the International Searching Authority, Application No. PCT/US18/065991, dated Mar. 8, 2019.".
(Continued)

*Primary Examiner* — Matthew D Sandifer
*Assistant Examiner* — Emily E Larocque
(74) *Attorney, Agent, or Firm* — Jeffrey Schox; Padowithz Alce

(57) ABSTRACT

Systems and methods of configuring a fixed memory array of an integrated circuit with coefficients of one or more applications includes identifying a utilization constraint type of the fixed memory array from a plurality of distinct utilization constraint types based on computing attributes of the one or more applications; identifying at least one coefficient mapping technique from a plurality of distinct coefficient mapping techniques that addresses the utilization constraint type; configuring the fixed memory array according to the at least one coefficient mapping technique, wherein configuring the array includes at least setting within the array the coefficients of the one or more applications in an arrangement prescribed by the at least one coefficient mapping technique that optimizes a computational utilization of the fixed memory array.

20 Claims, 14 Drawing Sheets

Related U.S. Application Data

(60) Provisional application No. 62/607,203, filed on Dec. 18, 2017.

(56) References Cited

U.S. PATENT DOCUMENTS

| | | |
|---|---|---|
| 2014/0344194 A1 | 11/2014 | Lee et al. |
| 2015/0199963 A1 | 7/2015 | Maaninen |
| 2016/0342722 A1 | 11/2016 | Sentieys et al. |
| 2017/0330617 A1 | 11/2017 | Friedman et al. |
| 2018/0341517 A1 | 11/2018 | Takeshige |

OTHER PUBLICATIONS

Demler, Mike, "Mythic Multiplies in a Flash, Analog In-Memory Computing Eliminates DRAM Read/Write Cycles", The Linley Group Microprocessor report, Aug. 27, 2018.

Liu, Pei, et al., "A Course-Grained Reconfigurable Processor for Sequencing and Phylogenetic Algorithms in Bioinformatics,", 2011 International Conference on Reconfigurable Computing and FPGAs, IEEE Computer Society, 2011, p. 190-197.

Venkataramani, S., et al., "SCALEDEEP: A Scalable Compute Architecture for Learning and Evauating Deep Networks,", ISCA '17, Jun. 24-28, 2017, p. 13-26.

Wang, Chao, et al., "DLAU: A Scalable Deep Learning Accelerator Unit on FPGA", IEEE Transactions on Computer-Aided Design of Integrated Circuits and Systems, May 23, 2016.

Zidan, Mohammed A., et al., "Field-Programmable Crossbar Array (FPCA) for Reconfigurable Computing,", IEEE Transactions on Multi-Scale Computing Systems, vol. 4, No. 4, Jun. 28, 2017, p. 698-710.

300

IDENTIFYING A UTILIZATION CONSTRAINT S310

IDENTIFYING A COEFFICIENT MAPPING TECHNIQUE S320

IDENTIFYING AN INPUT/OUTPUT HANDLING TECHNIQUE S325

CONFIGURING THE FIXED MEMORY RESOURCE S330

FIGURE 3A

SYSTEMS AND METHODS FOR MAPPING MATRIX CALCULATIONS TO A MATRIX MULTIPLY ACCELERATOR

CROSS-REFERENCE TO RELATED APPLICATIONS

This application is a continuation of U.S. patent application Ser. No. 16/222,277, filed 17 Dec. 2018, which claims the benefit of U.S. Provisional Application No. 62/607,203, filed 18 Dec. 2017, which are incorporated in their entireties by this reference.

TECHNICAL FIELD

The inventions relate generally to the integrated circuitry architecture field, and more specifically to new and useful mixed signal integrated circuits and methods of computing signals in the integrated circuitry architecture field.

BACKGROUND

Today, implementations of artificial intelligence are driving innovation in many fields of technology. Artificial intelligence systems and artificial intelligence algorithms include many models that enable learning (deep learning), reasoning, and data processing capabilities of a machine (e.g., a computer). These AI systems and models are often trained intensively to perform one or more specific tasks, such as natural language processing, image recognition, planning, decision-making, and the like. Neural network training, for example, in many cases may take thousands of hours across the training cycle and many terabytes of training data to fine tune an associated algorithm before use.

However, once trained, a neural network model or algorithm may be deployed quickly to make inferences based on relatively smaller datasets than training datasets to accomplish specific tasks (e.g., recognizing speech from speech input data, etc.). The inferences made by the neural network model or algorithm based on the dataset may be a prediction about what the neural network calculates to be a correct answer or indication.

Still, while neural network models or algorithms may not require a same amount of compute resources as required in a training phase, deploying a neural network model or algorithm in the field continues to require significant energy and compute power to classify data and infer or predict a result. This is because many of the traditional computers and systems that implement neural network models or algorithms tend to be larger to accommodate a great amount of circuitry needed for computing power and increased data processing speeds when implementing the neural network model and due to the large size of the circuitry, more energy is required to enable the compute power of the many circuits.

These traditional computers and systems for implementing artificial intelligence models and, namely, neural network models may be suitable for remote computing, such as in distributed computing systems (e.g., the cloud), or when using many onsite computing servers and the like. However, latency problems are manifest when these remote artificial intelligence processing systems are used in computing inferences and the like for remote edge computing or in field devices. That is, when these traditional remote systems seek to implement a neural network model for generating inferences to be used in remote field devices, there are unavoidable delays in receiving input data from the remote field devices because the input data must often be transmitted over a network with varying bandwidth and subsequently, inferences generated by the remote computing system must be transmitted back via a same or similar network.

Implementing AI processing systems at the field level may be a proposed solution to resolve some of the latency issues. However, attempts to implement some of these traditional computers and systems at an edge device (or in field of use device) may result in a bulky system with many circuits, as mentioned above, that consumes significant amounts of energy due to the architecture of the computing system used in generating inferences. Thus, such a proposal may not be feasible and/or sustainable.

Accordingly, there is a need for a deployable system for implementing artificial intelligence models in the field, and preferably to be used in edge devices, that do not result in large, bulky (edge) devices and that have necessary compute power to make predictions or inferences while also being energy efficient.

The below-described embodiments of the present application provide such advanced and improved integrated circuits and implementation techniques capable of addressing the deficiencies of traditional systems.

SUMMARY OF THE INVENTION

In one embodiment, a method of configuring an array of matrix multiply accelerators of an integrated circuit with coefficients of one or more computationally-intensive applications includes identifying a utilization constraint type of the array of matrix multiply accelerators from a plurality of distinct utilization constraint types based on computing attributes of the one or more computationally-intensive applications; identifying at least one coefficient mapping technique from a plurality of distinct coefficient mapping techniques that addresses the utilization constraint type; configuring the array of matrix multiply accelerators according to the at least one coefficient mapping technique, wherein configuring the array includes at least setting within the array the coefficients of the one or more computationally-intensive applications in an arrangement prescribed by the at least one coefficient mapping technique that optimizes a computational utilization of the array of matrix multiply accelerators.

In one embodiment, the method includes identifying at least one input/output handling technique based on the utilization constraint type; and configuring a multiplexor associated with the array of matrix multiply accelerators based on the at least one input/output handling technique.

In one embodiment, if a computation of at least one of the one or more computationally-intensive applications requires fewer inputs than a matrix coefficient input capacity of the array of matrix multiply accelerators, the at least one coefficient mapping technique includes partitioning the array of matrix multiply accelerators to: map coefficients of a first application of the one or more computationally-intensive applications to a first region of the array; and map coefficients of a second application of the one or more computationally-intensive applications to a second region of the array, wherein the first region and the second region of the array are non-overlapping regions and each have uncommon input ports.

In one embodiment, the method includes at runtime, executing one of the first region and the second region while deactivating one of the first region and the second region that is not executed.

In one embodiment, if a computation of at least one of the one or more computationally-intensive applications requires fewer outputs than a matrix output capacity of the array of matrix multiply accelerators, the at least one coefficient mapping technique includes partitioning the array of matrix multiply accelerators to: map coefficients of a first application of the one or more computationally-intensive applications to a first region of the array; and map coefficients of a second application of the one or more computationally-intensive applications to a second region of the array, wherein the first region and the second region of the array are non-overlapping regions and each have uncommon output ports.

In one embodiment, the method includes at runtime, executing one of the first region and the second region while deactivating one of the first region and the second region that is not executed.

In one embodiment, if a computation of at least two of the one or more computationally-intensive applications in combination require fewer inputs and fewer outputs than a matrix input capacity and a matrix output capacity, respectively, of the array of matrix multiply accelerators, the at least one coefficient mapping technique includes partitioning the array of matrix multiply accelerators to: map coefficients of a first application of the one or more computationally-intensive applications to a first region of the array; and map coefficients of a second application of the one or more computationally-intensive applications to a second region of the array, wherein the first region and the second region of the array are non-overlapping regions and each have uncommon input ports and uncommon output ports.

In one embodiment, the method includes at runtime, executing each of the first region and the second region in parallel.

In one embodiment, if a computation of at least two of the one or more computationally-intensive applications in combination require fewer inputs and fewer outputs than a matrix input capacity and a matrix output capacity, respectively, of the array of matrix multiply accelerators, the at least one coefficient mapping technique includes partitioning the array of matrix multiply accelerators to: map coefficients of a first application of the one or more computationally-intensive applications to a first region of the array; and map coefficients of a second application of the one or more computationally-intensive applications to a second region of the array, wherein the first region and the second region of the array have partially overlapping input regions are and have uncommon output ports.

In one embodiment, if each of multiple distinct applications of the one or more computationally-intensive applications require large inputs that exceed an inputs threshold and each have fewer outputs below an outputs threshold: the at least one coefficient mapping technique includes partitioning the array of matrix multiply accelerators to: map coefficients of each of the multiple distinct applications to multiple distinct regions of the array such that the coefficients of each of the multiple distinct applications are arranged in parallel and each of the multiple distinct regions are arranged along uncommon output ports; and the at least one input/output handling technique includes setting the multiplexor to serially output computation results of each of the multiple distinct applications via a common output circuit.

In one embodiment, if a computation of multiple distinct applications of the one or more computationally-intensive applications in combination require fewer inputs and fewer outputs than a matrix input capacity and a matrix output capacity of the array of matrix multiply accelerators, the at least one coefficient mapping technique includes partitioning the array of matrix multiply accelerators to: map coefficients of each of the multiple distinct applications of the one or more computationally-intensive applications to a plurality of distinct regions of the array, wherein the plurality of distinct regions include distinct regions having overlapping input ports and overlapping output ports; the method further comprises: serially executing each of the plurality of distinct regions of the array by selecting one of the plurality of distinct regions for active execution and disabling an execution of remaining distinct regions of the plurality of distinct regions.

In one embodiment, if a computation of at least one of the one or more computationally-intensive applications requires greater inputs than a matrix input capacity and/or greater outputs than a matrix output capacity of the array of matrix multiply accelerators, the at least one coefficient mapping technique includes: partitioning coefficients of the at least one computationally-intensive application to multiple distinct arrays of matrix multiply accelerators; the method further comprises: applying an input vector to each of the multiple distinct arrays of matrix multiply accelerators; collecting outputs computed by each of the multiple distinct arrays of matrix multiply accelerators; and combining the outputs of the multiple distinct arrays of matrix multiply accelerators.

In one embodiment, the method includes configuring the array of matrix multiply accelerators to produce positive outputs and produce negative logical outputs based on input signals into the array includes: configuring one or more matrix coefficient input locations within the array with a positive line that passes an input signal with a positive sign and a negative line that passes an input signal with a negative sign; and setting a matrix coefficient along each of the positive line and the negative line of the one or more matrix coefficient input locations.

In one embodiment, if an input vector into the array of matrix multiply accelerators includes a greater bit-size than a bit-size of a matrix coefficient input location within the array, the at least one coefficient mapping technique includes: prior to receiving bits of an input vector having oversized input bits, shifting coefficients of an undersized matrix coefficient input location to multiple rows of the array, the method further comprising: at runtime, spreading bits of the input vector over the multiple rows of the array; and summing outputs of the multiple rows of the array that share a common coefficient value.

In one embodiment, if input vector into the array of matrix multiply accelerators includes a greater bit-size than a bit-size of a matrix coefficient input location within the array, the at least one input/output handling technique includes: partitioning bits of the input vector having oversized input bits over multiple calculations of the array in a serial manner or stepped fashion; the method further comprising: shifting outputs of the multiple calculations of the array into an alignment prior to summing output values of the multiple calculations.

In one embodiment, the one or more computationally-intensive applications comprise one or more distinct machine learning applications.

In one embodiment, a method of configuring a fixed memory array of an integrated circuit with coefficients of one or more applications includes identifying a utilization constraint type of the fixed memory array from a plurality of distinct utilization constraint types based on computing attributes of the one or more applications; identifying at least one coefficient mapping technique from a plurality of distinct coefficient mapping techniques that addresses the utilization constraint type; configuring the fixed memory array according to the at least one coefficient mapping technique, wherein configuring the array includes at least setting within the array the coefficients of the one or more applications in an arrangement prescribed by the at least one coefficient mapping technique that optimizes a computational utilization of the fixed memory array.

In one embodiment, the method includes identifying at least one input/output handling technique based on the utilization constraint type; and configuring a multiplexor associated with the fixed memory array based on the at least one input/output handling technique.

In one embodiment, a system for configuring a fixed memory array of an integrated circuit with coefficients of one or more applications includes a fixed memory array that includes: a fixed number (M) of input ports that operate to receive M input signals; a fixed number of (N) output ports being one or more bits wide that operate to output N output values; a fixed number of memory elements W that store coefficients and/or weights of a given application; a multiplexor that is in operable communication with the fixed memory array that operates to select one or more input settings and/or output settings of the fixed memory array, wherein the fixed memory array is configured according to at least one coefficient mapping technique selected from a plurality of distinct coefficient mapping techniques, wherein configuring the fixed memory array includes at least setting within the fixed memory array the coefficients of the one or more applications in an arrangement prescribed by the at least one coefficient mapping technique that optimizes a computational utilization of the fixed memory array.

BRIEF DESCRIPTION OF THE FIGURES

FIG. 3A illustrates an example method for mapping a matrix calculation in accordance with one or more embodiments of the present application;

DESCRIPTION OF THE PREFERRED EMBODIMENTS

Figure 1:
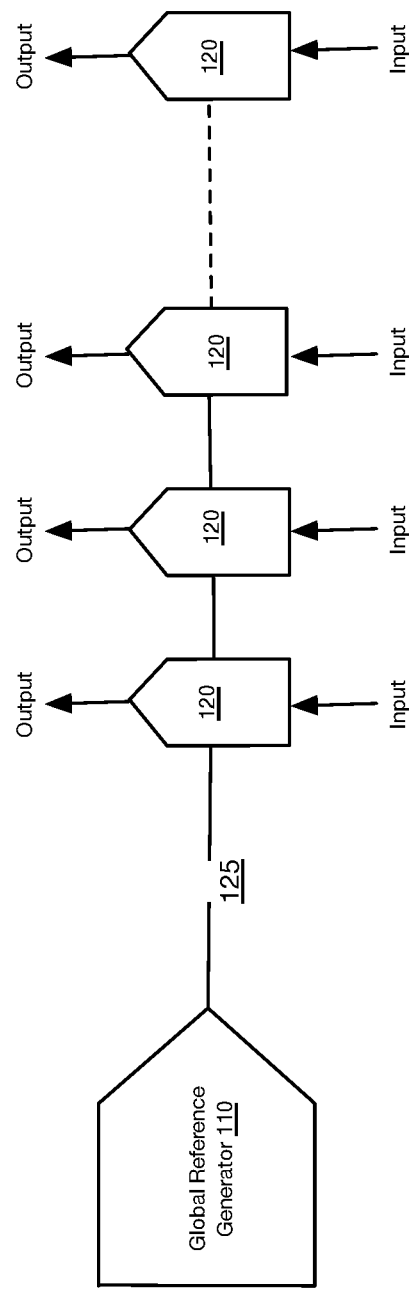
FIG. 1 illustrates a schematic of a system 100 in accordance with one or more embodiments of the present application.

The following description of preferred embodiments of the present application are not intended to limit the inventions to these preferred embodiments, but rather to enable any person skilled in the art of to make and use these inventions.

Overview

In configuring integrated circuits that may implement computationally-intensive programs or applications (e.g., deep neural network algorithms or the like), a mapping of the weights and the like of the computationally-intensive programs or applications to the various arrays of the integrated circuit is generally required. In a particular, some machine learning algorithms may include millions of weights that must be fit onto a specific integrated circuit. In such circumstance, the millions of weights of the machine learning algorithms can typically be applied onto an integrated circuit so long as the integrated circuit includes sufficient storage capacity to hold each of the weights (e.g., millions of units of memory, etc.).

However, in some instances, even if an integrated circuit includes sufficient memory along its arrays to store the millions of weights of a machine learning algorithm or the like, other constraints of the integrated circuit, such as a fixed number of inputs and/or fixed number of outputs may not match or may be misaligned with exact configurations of the matrixes of weights of the machine learning algorithm and/or similar computationally-intensive application.

Therefore, a flexible approach to mapping matrices of weights or the like of a machine learning algorithm (or other computationally-intensive application/program) is required.

Accordingly, one or more embodiments of the present application enable a mapping of applications and/or algorithms (e.g., a graph of calculations and weights) to integrated circuitry having a predetermined architecture or design, as described in U.S. patent application Ser. No. 16/127,488 and U.S. Patent Application No. 62/694,355, which are incorporated herein in their entireties by this reference. In some embodiments, a system implementing a plurality of matrix multiply accelerators may be implemented. The applications and/or algorithms may be mapped to the plurality of matrix multiply accelerators in such a manner to optimize utilization and/or performance of the plurality of matrix multiply accelerators by implementing one or a combination of matrices mapping techniques disclosed herein below.

While the one or more embodiments described herein below may typically function to map applications and/or programs to matrix accelerator units, it shall be understood that the one or more (or a combination of) the embodiments of the present application may be implemented to map any suitable function, application, program, or the like including, but not limited to, machine learning algorithms (including neural network calculations and/or algorithms), Discrete Fourier Transforms (at any frequency per output), a combination of Discrete Fourier Transform and Fast Fourier Transform (e.g., for audio feature extraction, etc.), DNA sequencing, global positioning signals (where the channels are different frequency shifts), and the like.

1. System Implementing Mixed-Signal Compute Architecture

Figure 1A:
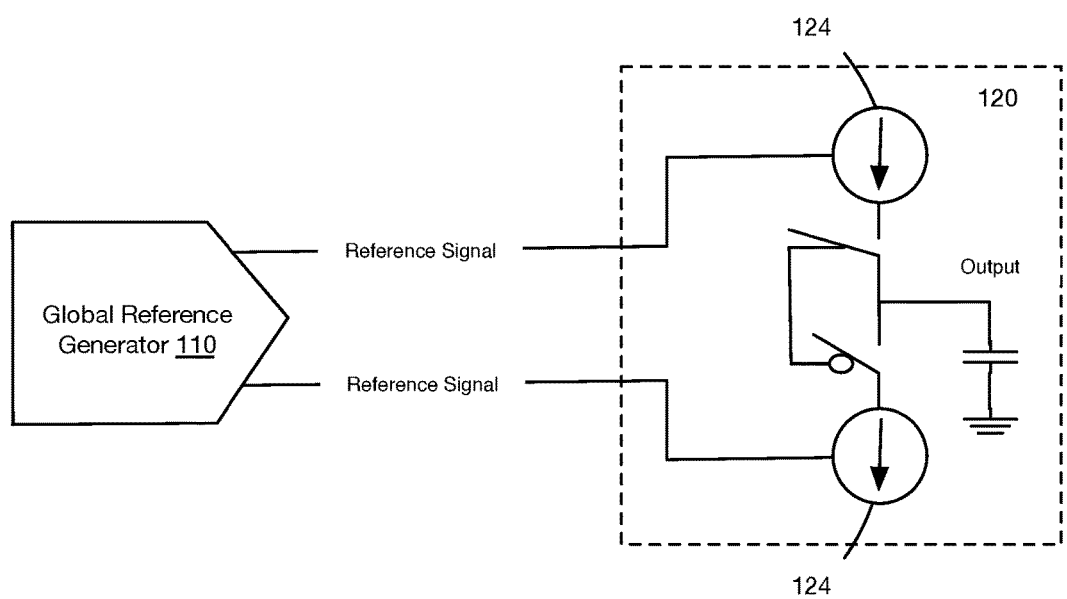
FIG. 1A illustrates one implementation of one or more portions of the system 100 in accordance with one or more embodiments of the present application.

As shown in FIG. 1, a system 100 for implementing mixed-signal computing for computationally-intensive programs and/or applications includes a global reference generator 110, a plurality of local accumulators 120, and a shared signal path 125. As shown in FIG. 1A, the local accumulators 120 may each include an energy storage device 122, and current mirrors 124.

The system 100 preferably functions to bifurcate typical functionality of a digital-to-analog converter into at least two component devices. The first component, in several embodiments, includes the global reference generator 110 that functions to define or generate one or more (analog) reference signals. In some embodiments, the global reference generator 110 may comprise a binary-weighted global reference generator. The second component, in several embodiments, includes a set of local accumulating devices that function to receive, via a shared signal path 125, the reference signals from the global reference generator 110 and further function, in some embodiments, to perform some arithmetic function (e.g., addition, subtraction, etc.) of the values of the reference signals over a set period of time.

The system 100 functions to achieve scale and area efficiency (e.g., to make a smaller integrated circuit) with, at least, the above-described configuration by allowing the first component to be large and capable of generating accurate reference signals for the second component comprising the set of small, local accumulating devices. That is, the area and power of the first component (which would be matching and noise limited) is now amortized. Therefore, the system 100 enables an integrated circuit architecture that is capable of performing computationally-intensive operations while having extremely high area and power efficiencies.

The global reference generator 110 functions to generate reference signals for each of a plurality of local accumulators 120. Preferably the global reference generator 110 comprises a global digital-to-analog converter (DAC), as shown in FIGS. 1-1A. In such case, the global DAC may function to receive, as inputs, digital signals (e.g., binary number or input) from an external source and function to output analog reference signals (e.g., a voltage or current signal) to a plurality of local DACs. Accordingly, the global DAC may function to generate analog reference signals to the local accumulators (e.g., local DACs) based on digital input received at the global DAC. Additionally, or alternatively, the reference signal generated and transmitted by the global reference generator 110 to each of the local accumulators may be an analog reference signal, such as a current or voltage, that may be used to control or drive functionality of the local accumulators 120. Accordingly, the global reference signals provided by the global reference generator 110 are preferably transmitted to the local accumulators 120 via a shared signal path 125 (e.g., a shared or common wire) that operably connects the local accumulators 120 to each other as well as to a same global reference generator 110.

Figure 2:
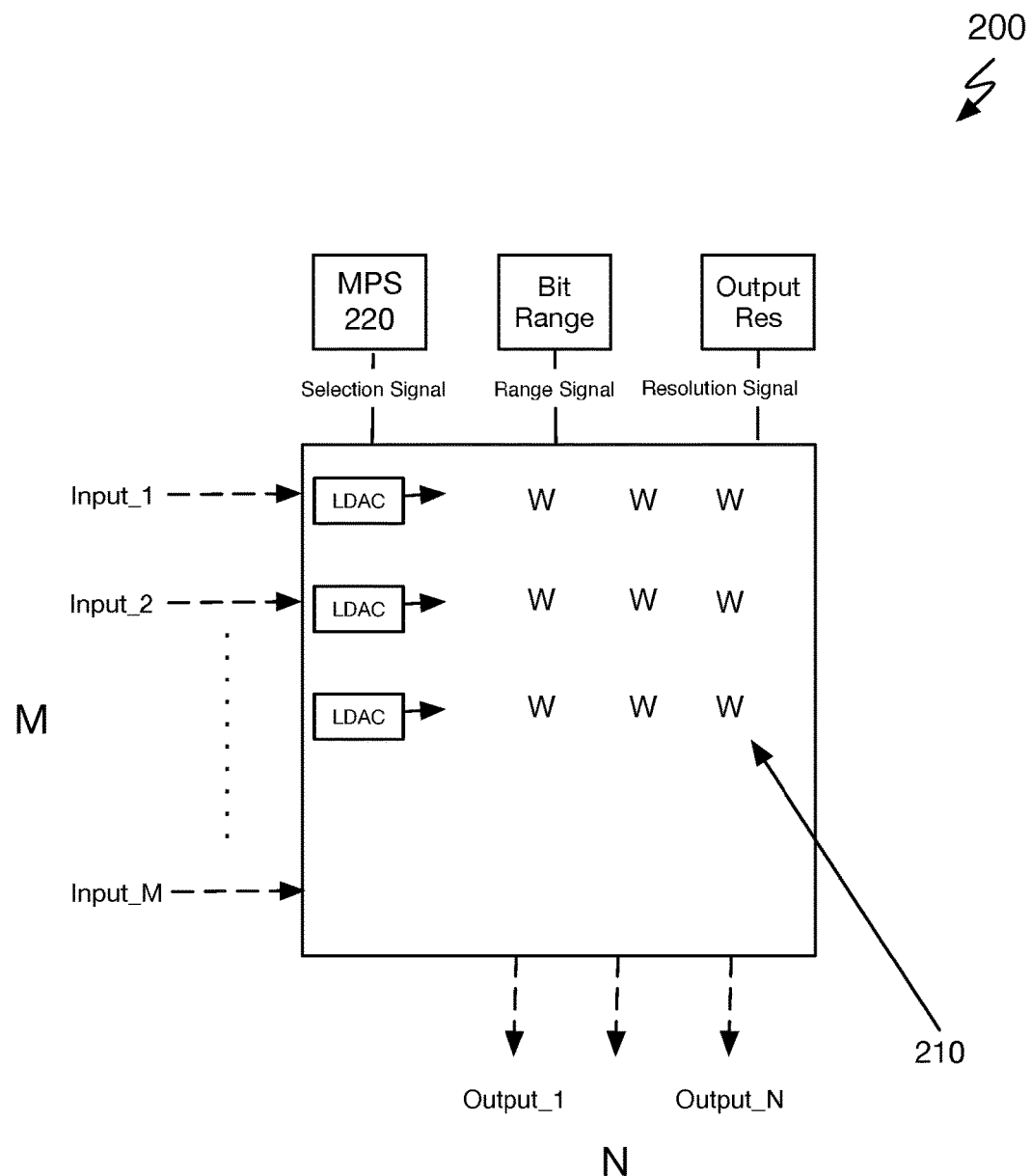
FIG. 2 illustrates a schematic of a matrix multiply accelerator in accordance with one or more embodiments of the present application.

With respect to FIG. 2, FIGURE illustrates one implementation of the global DAC-to-local DACs architecture in which a plurality of local DACs (LDACs) function to receive one or more analog reference signals from a single global DAC (GDAC). Accordingly, local input (e.g., A_input, B_input, etc.) being received at each local DAC may be applied against a tunable resistor that generates an amount of current charge. With each column of tunable resistors acting as a neuron (of a neural network) in combination, the current output generated at each tunable resistor in a neuron column may be aggregated, as illustrated in FIG. 2A, to form a single, aggregate current output (e.g., neuron output).

Figure 2A:
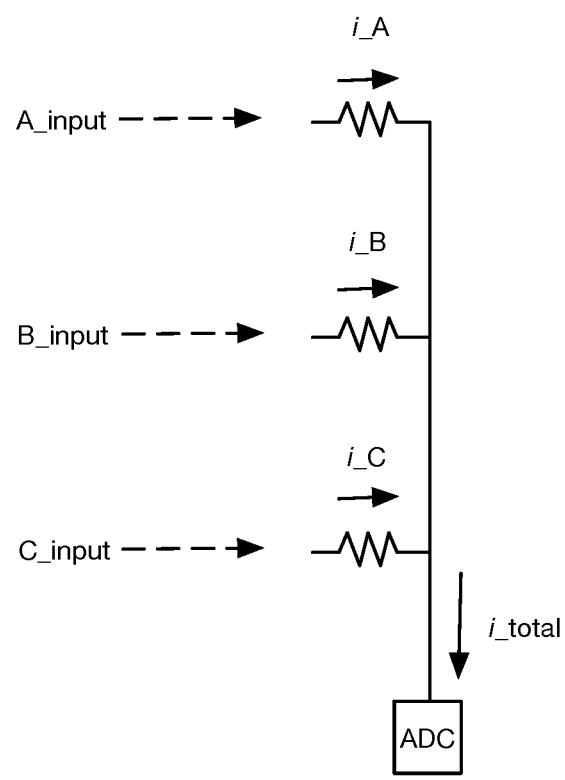
FIG. 2A illustrates a specific implementation of a system for mixed-signal computing in accordance with one or more embodiments of the present application.
Figure 2B:
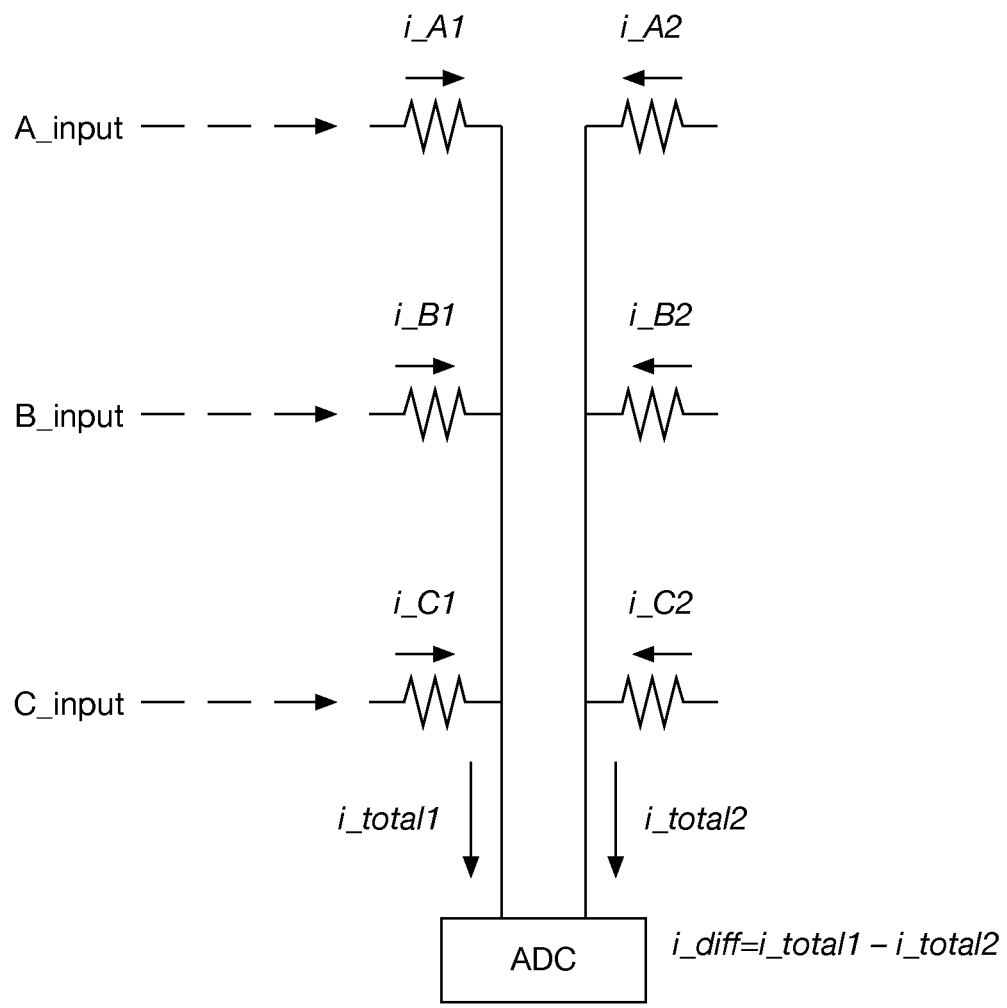
FIG. 2B illustrates a specific implementation of the system for mixed-signal computing of FIG. 2 in accordance with one or more embodiments of the present application.

Additionally, or alternatively, FIG. 2B illustrates a variant of the implementation according to FIG. 2A using a differential column. In this variant, the differential column uses two wires and two columns of tunable resistors to create a differential calculation. Each differential column acts as a single neuron. Each resistor element pair generates a pair of currents when the corresponding input is activated. The difference in I_total1 and I_total2 determines the resulting value in the ADC.

Accordingly, in typical digital circuitry used for implementing neural network models, the matrix multiplication calculations are performed using digital values (binary values). By comparison, in embodiments of the system 100 implementing a mix-signal computing architecture, the matrix multiplication calculations are performed in the current (analog) domain thereby allowing for up to fifty times (50×) or greater improvement in power consumption by the system. That is, the system 100 functions to lower power consumption by up to 50× or greater.

Generally, the global reference generator 110 may be configured with a high-speed analog design with better matching and noise performance. Additionally, or alternatively, the configuration of the global reference generator 110 may include reference signal generation devices and/or circuitry that allows the global reference generator 110 to generate analog reference signals and also, causes the global reference generator 110 to be large relative to each of the plurality of local accumulators 120. Additionally, or alternatively, the global reference generator 110 may be configured to transmit reference signals sequentially (e.g., one at a time) or simultaneously (e.g., multiple signals per clock cycle). It shall be noted that the global reference generator 110 may be configured to generate and/or transmit reference signals in any suitable manner contemplated herein or otherwise known in the art.

The shared signal path 125 may be a single signal wire, signal trace, or signal path with multiple connections to the plurality of local accumulators 120. The shared signal path preferably functions to allow a transmission of reference signals from the global reference generator 110 to each of the plurality of local accumulators 120 that are connected thereto or positioned along the shared signal path 125. The shared signal path 125 may be configured such that any reference signal originating from the global reference generator 110 being transmitted along the shared signal path 125 may be copied or otherwise, mirrored by each of the local accumulators 120 connected to the shared signal path 125.

In one implementation, the shared signal path 125 may be used by the global reference generator 110 to provide serialized (analog) reference signals. Accordingly, in such implementation, the shared signal path 125 may function to provide single bit reference signals every clock cycle to the local accumulators 120. For instance, if the global reference generator 110 comprises a three-bit DAC or the like, the shared signal path 125 may provide each of the three bits individually and sequentially to each of the plurality of local accumulators 120. In this way, the shared signal path 125 enables a single signal source (e.g., the global reference generator) to provide accurate reference signals to multiple local accumulators in lieu of a dedicated signal source for each of the local accumulators 120. A technical benefit of such configuration is considerably smaller circuitry for implementing computationally-intensive applications and/or programs (e.g., neural network models, etc.).

The local accumulators 120 may function to generate an analog output to a local output receiver (e.g., local analog-to-digital converter) or the like, such as illustrated in FIG. 2A. In a preferred embodiment, the plurality of local accumulators 120 comprise a plurality of local digital-to-analog converters (LDACs) that may function to generate the analog output over several clock cycles using the global reference signals from the global reference generator 110. It shall be noted that depending on the reference signal generation mode of the global reference generator 110, the plurality of local accumulators 120 may generate the analog output over a single clock cycle. The configuration of the LDACs may generally exclude reference signal generation devices, as the reference signals for each of the LDACs may be provided by the global reference generator 110 and in general, the reference signal generation devices and/or circuitry are large. Resultantly, this configuration enables the LDACs to be considerably smaller in size and area consumed on a printed circuit board or panel of an integrated circuit. In comparison to a global DAC, for instance, the LDACs may be up to ten (10) to twenty (20) or more times smaller in size and area. This allows for great area and power efficiencies on an integrated circuit or computer chip. However, it shall be noted that, in some embodiments, each of the plurality of LDACs may include one or more types of reference signal accumulation/aggregation/summation/reconstruction circuitry that function to output a resultant reference signal, as discussed in more detail below. That is, while in some embodiments, the local accumulators 120 (or LDACs) may function to accumulate reference signals, it is also possible in some variations for the local accumulators to increment/decrement an energy storage device or perform summation functions based on the encoding scheme of the global reference generator 110 and the configuration of each respective local accumulator.

As mentioned above, each of the plurality of local accumulators 120 may include an energy storage device, current mirrors 124, and in some embodiments, comparator circuitry. The energy storage device preferably functions to store locally at the local accumulator 120 energy values, such as analog energy values including current or voltage values. Preferably the energy storage device comprises a capacitor, however, the energy storage device may be any suitable electrical energy storing element, such as a flash transistor operating in series or the like. In some embodiments, each of the plurality of local accumulators 120 may function to perform arithmetic functions against the energy storage device based on one or more signal inputs (e.g., sequential inputs). Accordingly, a local accumulator 120 may function to add and/or subtract charge on the energy storage device. Each local accumulator 120 may, additionally or alternatively, function to integrate a (voltage) charge on the capacitor based on one or more signal inputs.

The current mirrors 124 of each of the plurality of local accumulators 120 function to duplicate or copy a reference current signal provided through the shared signal path 125. Specifically, in some embodiments, the global reference generator 110 functions to provide a reference current signal via the shared signal path 125. The reference current signal may be received by each of the local accumulators 120 connected to or positioned along the shared signal path 125. Accordingly, using the current mirrors 124 at each respective local accumulator 120, the local accumulator 120 functions to copy the reference current signal (e.g., the global reference signal) for purposes of generating or accumulating an output signal.

In a preferred embodiment, the current mirrors 124 comprise circuits designed to copy a current through one active device by controlling the current in another active device of a circuit while keeping the output current constant irrespective of loading. The current mirrors 124 may function to copy a varying signal current or a constant signal current (depending on whether the global reference generator 110 provides a constant or varying global reference signal) and provide bias currents and/or active loads to circuits. Preferably, the circuits defining the current mirrors 124 include an inverting current amplifier (ideally) that, in most embodiments, functions to reverse a current direction as well or may be a current-controlled current source. However, it shall be noted that the current mirrors may include any suitable circuitry for copying a reference current signal.

Referring to FIG. 1A, one implementation of a local accumulator 120 is illustrated in which the global reference generator 110 functions to generate bias voltages (e.g., global reference signals) for two current mirrors 124 in the local accumulator 120. The bias voltages provided by the global reference generator 110 may be generated such that the currents copied in the current mirrors 124 are weighted. For instance, in a binary implementation of the global reference generator 110 of system 100, bias voltages generated by the global reference generator 110 may be updated every clock cycle. In this way, the copied current in the current mirrors 124 changes in a binary fashion. In this implementation, a sequential input or the like may be added in some charge on the energy storage device 122 (capacitor) of the local accumulator 120 or some charged subtracted from the energy storage device 122. The amount of charge that is added to or subtracted from the energy storage device 122 is preferably a function of the copied current in the local accumulator 120—since the copied current changes in a binary fashion, the charge added or subtracted functions to change in a similar or same manner. Accordingly, for an N-bit (e.g., 8-bit) global DAC or the like, N (e.g., N=8) clock cycles would be required to create a required output at the local DAC.

In one variant implementation of the system 100, the local accumulator 120 when implemented as an LDAC functions to increment/decrement a charge on an energy storage device 122 based on thermometer encoded reference signals provided by the global reference generator no. In such variant implementation, an amount of charge incremented or decremented from the energy storage device 122 may be constant in each clock cycle. In such implementation, for an N-bit global reference generator 110, $2^N$ cycles would be required to create a required output at the local accumulator 120 (LDAC).

Additionally, in yet a further implementation, a segmented global reference generator no may be implemented in which two or more global reference generators are combined to achieve a single, higher resolution global reference generator no to provide a required performance (e.g., more accurate reference signal generation, better matching, higher noise performance, etc.). In use, the different segments of the higher resolution global reference generator may be used to handle various signal generation tasks where the outputs of these different segments may be combined to achieve a unitary output.

Additionally, or alternatively, the system 100 may, in some embodiments, include a plurality of local analog-to-digital converters (ADCs) (not shown) that function to receive outputs from the output circuitry of plurality of local accumulators 120. Specifically, in some embodiments, once a local accumulator 120 has achieved a sufficient (stored) charge value on a capacitor or the like, this charge value may be output or define an analog reference signal to a corresponding local ADC that converts an analog input signal to a binary output by comparing it to the analog reference signal. In such embodiments, each local ADC may include comparator circuitry that may be used to compare the analog input signal to a reference signal for purposes of determining or generating the binary output.

Similar to the global DAC-to-local DACs architecture(s) described herein, a global reference signal generator (e.g., a global ADC) to local ADCs architecture may be implemented. In such implementation, a plurality of local ADCs may be provided one or more reference signals from a global ADC via a shared common signal path. Such configuration should similarly achieve several technical benefits including a smaller area of circuitry architecture, energy efficiencies (e.g., lower power consumption), and the like.

2. Matrix Multiply Accelerator

As shown in FIG. 2, a schematic representation of a matrix multiply accelerator unit 200 is illustrated. The matrix multiply accelerator unit 200 may include a plurality of internal memory elements 210 representing a matrix of coefficients stored therein. In one example, an input row vector may typically be multiplied by the matrix of coefficients stored within the internal memory elements 210 of the matrix multiply accelerator unit 200 to generate an output row vector.

The matrix multiply accelerator unit 200 of FIG. 2 preferably includes M input signals. In some embodiments, an amount M of input signals receivable by the matrix multiply accelerator unit 200 may depend on a number of rows of the matrix multiply accelerator unit 200, such that M equals the number of rows of the matrix multiply accelerator unit 200. As shown in the exemplary illustration of the matrix multiply accelerator unit 200 in FIG. 2, the inputs signals are typically considered to be entering a side of the matrix multiply accelerator unit 200. It shall be noted, however, that any suitable configuration for receiving input signals at the matrix multiply accelerator may be implemented, such as receiving input signals from a top, opposite side, bottom, and/or perpendicular to a plane of the matrix multiply accelerator 200. The M input signals received by the matrix multiply accelerator unit 200 may each be one or more bits wide. The input signals may be shared across the rows of the matrix multiply accelerator unit 200 such that each column of the matrix multiply accelerator unit 200 receives the same set of inputs.

The matrix multiply accelerator unit 200 of FIG. 2 preferably includes N output signals. In some embodiments, an amount N of output signals that may be generated by the matrix multiply accelerator unit 200 may depend on a number of columns of the matrix multiply accelerator unit 200, such that N equals the number of columns of the matrix multiply accelerator unit 200. The N output signals generated by the matrix multiply accelerator unit 200 may each be one or more bits wide. The output signals are preferably generated based on multiplying each input signal of an input row vector by a corresponding matrix coefficient for a given row/column position within the matrix multiply accelerator unit 200. The resulting product may then be summed together with other calculated products in a column of the matrix multiply accelerator unit 200 to form an output value for a given column of the matrix multiply accelerator unit 200. This calculation is generally described as a multiply accumulate across the column of the matrix multiply accelerator unit 200.

Additionally, or alternatively, the matrix multiply accelerator unit 200 may include a multiplexor select 220. In such embodiments, the multiplexor select 220 may have multiple settings that enables the matrix multiply accelerator unit 200 to selectively present less physical outputs than the amount of outputs (N) that may be generated by the given matrix multiply accelerator unit 200. In particular, the multiplexor select 220 may function to select (or activate/deactivate) a subset of matrix coefficient columns for calculating outputs. In a selected or activated state, a selected subset of matrix columns may be made available for calculating a product for output. In an unselected or deactivated state, an unselected subset of matrix columns may be made unavailable or temporarily set to zero values, such that there is no product or the product equals to a zero value.

A value or signal provided to the multiplexor select 220 functions to cause the multiplexor select 220 to select a subset of outputs that will be presented on a physical output (P). In some embodiments, the selected columns or matrix coefficients of the matrix multiply accelerator unit 200 may be activated for calculating outputs while the unselected or non-selected columns or matrix coefficients of the matrix multiply accelerator unit 200 remain inactive or are deactivated by the multiplexor select 220. Preferably, a number of physical outputs presented is less than a number of outputs of the matrix multiply accelerator unit 200.

Additionally, or alternatively, the matrix multiply accelerator unit 200 may include internal coefficients (W) at each distinct row/column positions of the matrix multiply accelerator unit 200. Preferably, the internal coefficients (W) of the matrix multiply accelerator unit 200 may be multiplied against the inputs to help define or help calculate the outputs of the matrix multiply accelerator unit 200.

Additionally, or alternatively, matrix multiply accelerator unit 200 may function to enable output resolution selection. The output resolution selection may indicate how many bits wide the outputs of the matrix multiply accelerator unit 200 may be (i.e., a number of bits of the internal multiply accumulate operation that are presented on the outputs).

Additionally, the matrix accelerator unit 200 can use some inputs for addition terms into the matrix multiply. These terms can be used to add a constant offset or be used for other analog purposes. Neural networks commonly have biases added to operations and these addition terms can be used for applying biases. Differential analog circuits can operate with better performance in certain voltage ranges and using additional input terms can be used to improve the performance with this common mode adjustment.

3. Systems and/or Methods for Implementing and/or Mapping a Matrix Multiply Accelerator As shown by example in FIG. 3A, a method 300 of configuring an array of matrix multiply accelerators of a mixed-signal computing integrated circuit with coefficients of one or more computationally-intensive applications includes identifying a utilization constraint type S310, identifying at least one coefficient mapping technique S320, and configuring the array of matrix multiply accelerators S330. Optionally, the method may include identifying at least one input/output handling technique S325.

S310, which includes identifying a utilization constraint type, may function to identify a utilization constraint of an array of matrix multiply accelerators from a plurality of distinct MMA utilization constraint types based on computing attributes of the one or more computationally-intensive applications. One or more computing attributes of the applications may include, but are not limited to, bit sizes of input vectors and output vectors, a number of input vectors and output vectors, a number of weights and/or coefficients, requirements for positive and negative output values, and the like. The MMA utilization constraint types may include, but are not limited to, fixed dimensions for mapping coefficients and/or weights, limited input and/or output bit sizes, an inability to compute negative input values, and the like.

S320, which includes identifying at least one coefficient mapping technique, may function to select a coefficient and/or weight mapping technique that optimizes over the identified utilization constraint type of the array of matrix multiply accelerators. For instance, S320 may function to select among one or more suitable mapping techniques described below in sections 3.1-3.9 and the like.

Optionally, S325, which includes identifying at least one input/output handling technique, may function to select at least one input/output handling technique based on the utilization constraint type of the array of matrix multiply accelerators. In one example, S325 may function to configure or set a multiplexor associated with the array based on the at least one input/output handling technique, which are described in the one or more following sections.

S330, which includes configuring the array of matrix multiply accelerators, may function to configure the array of matrix multiply accelerators by setting within the array coefficients and/or weights of the one or more computationally-intensive applications in an arrangement prescribed by the selected at least one coefficient mapping technique that optimizes a computational utilization and/or performance of the array of matrix multiply accelerators.

3.1 Partition by Input Regions

Figure 3:
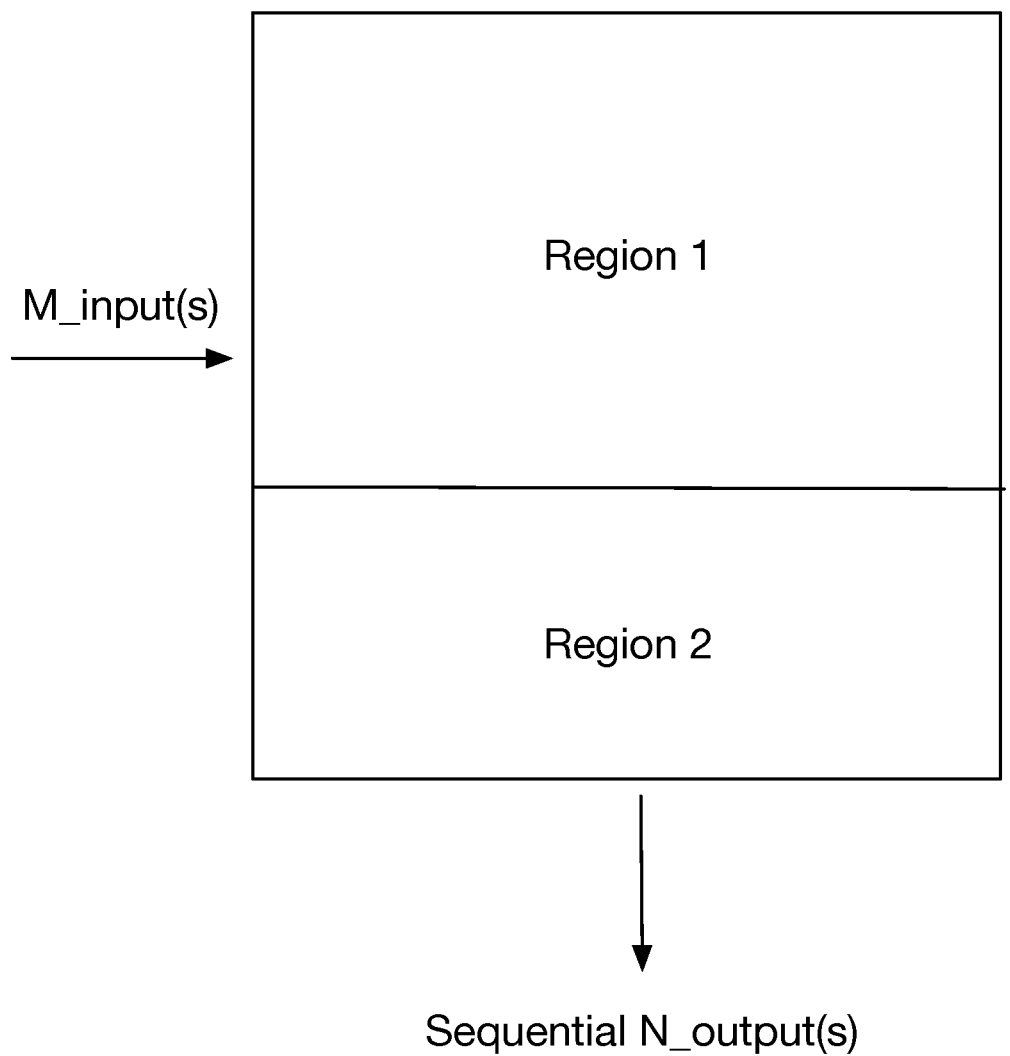
FIG. 3 illustrates a first implementation for mapping a matrix calculation to a matrix multiply accelerator in accordance with one or more embodiments of the present application.

As shown in FIG. 3, a first implementation for mapping matrix coefficients to an array of a matrix multiply accelerators of an integrated circuit is provided. This first implementation preferably includes mapping a matrix calculation that requires fewer inputs than a matrix input capacity of a given matrix multiply accelerator. Accordingly, the first implementation may include mapping multiple matrix calculations to individual matrix multiply accelerators to optimize a utilization of the arrays therein. In some embodiments, each of the multiple matrixes may be mapped onto an individual matrix multiply accelerator such that the respective matrix coefficients thereof extend from a first side of the matrix multiply accelerator to a second side of the matrix multiply accelerator.

It shall be noted that while several of the implementations described herein may preferably be implemented with a structure of one or more matrix multiply accelerators, it shall be noted that the techniques and/or methods of the present application may similarly and/or equally be applied with any suitable fixed matrix or other fixed memory array resource capable of storing coefficients of a computationally-intensive application. For example, other fixed memory array resources may include, but are not limited to, SRAM-based array architectures, capacitor-based array architectures, carbon nano tubes-based array architectures, FeRAM (ferroelectric ram) array architectures, any suitable memory storage element, and/or the like.

In this first implementation, two or more matrix calculations may be firstly identified. Identifying the matrix calculations typically includes determining a total number of matrix coefficients and/or matrix weights are required for each of the two or more matrix calculations. For instance, a matrix calculation may include one thousand twenty-four (1024) coefficient inputs or the like and therefore, may require 1024 memory locations (e.g., row/column locations of the matrix multiply accelerator) on a matrix multiply accelerator for storing each of the 1024 coefficient inputs. The inputs of the matrix may be any type of input for any type of application, program, or algorithm that is executable using one or more matrix multiply accelerators. For instance, the inputs of the matrix may include a number of weights and/or coefficients of a machine learning algorithm or the like.

Once the two or more matrix calculations are known, the array(s) or regions of a matrix multiply accelerator may be structured or configured to accommodate each of the two or more matrix calculations thereby allowing more than one matrix calculation to exist on a single matrix multiply accelerator. This, in turn, reduces a number of matrix multiply accelerators required for executing multiple matrix calculations. The matrix multiply accelerator may include a fixed number of input units and similarly, a fixed number of output units that may function to constrain a manner in which matrix calculations are stored and/or executed on the matrix multiply accelerator.

In this first implementation, if a first matrix calculation includes fewer matrix inputs than a matrix input capacity of a matrix multiply accelerator, then the first matrix calculation may be mapped to a first array region of the matrix multiply accelerator while zeroing an unused array region of the matrix multiply accelerator at runtime. That is, the first matrix calculation may be modified to include additional zeros at the unused locations of the matrix multiply accelerator. Accordingly, to optimize a utilization of the matrix multiply accelerator, a second matrix calculation that includes fewer than the matrix input capacity of the matrix multiply accelerator may also be mapped together with the first matrix calculation. That is, the portions of the second matrix calculation that may fit within the unused array region (or outstanding portions) of the matrix multiply accelerator may be added to the matrix multiply accelerator and, at runtime, the array region of the first matrix calculation may be zeroed or made inactive.

Additionally, an area of a matrix multiply accelerator may be segments or partitioned based on a matrix configuration of the two or more matrix calculations. Specifically, prior to mapping the two or more matrix calculations to the matrix multiply accelerator, the matrix multiplier may be partitioned to optimize a utilization of a matrix input capacity of the matrix multiply accelerator and thereby enable a maximum number of matrix calculation to be stored at one time.

Additionally, or alternatively, in the case that a matrix calculation exceeds the matrix input capacity of a matrix multiply accelerator, the matrix calculation may be partitioned into multiple calculations that may be mapped onto regions of multiple matrix multiply accelerators.

Preferably, an area of a matrix multiply accelerator may be partitioned into rectangular or square regions that suitably fit rectangular and/or square configurations of the two or more matrix calculations being mapped thereon. However, it shall be noted that the matrix multiply accelerator may be partitioned in any suitable manner.

Additionally, if the multiple matrix calculations are mapped onto multiple regions of a single matrix multiply accelerator, each of the regions of the matrix multiply accelerator may be executed sequentially (e.g., one at a time). That is, rather than executing the matrix calculations in parallel, the first implementation executes the matrix input at the matrix multiply accelerator by the partitioned input regions in a sequential order. By executing the matrix calculations in this manner, it avoids a summation of disparate matrix calculations by the matrix multiply accelerator.

It shall be noted that, while only a first and second matrix calculation is described as capable of being mapped to a same matrix multiply accelerator, the embodiments of the present application should not be limited to these examples, but rather any number of disparate matrix calculations may be mapped to a same matrix multiply accelerator to optimize the matrix input capacity thereof.

3.2 Partition by Output Regions

Figure 4:
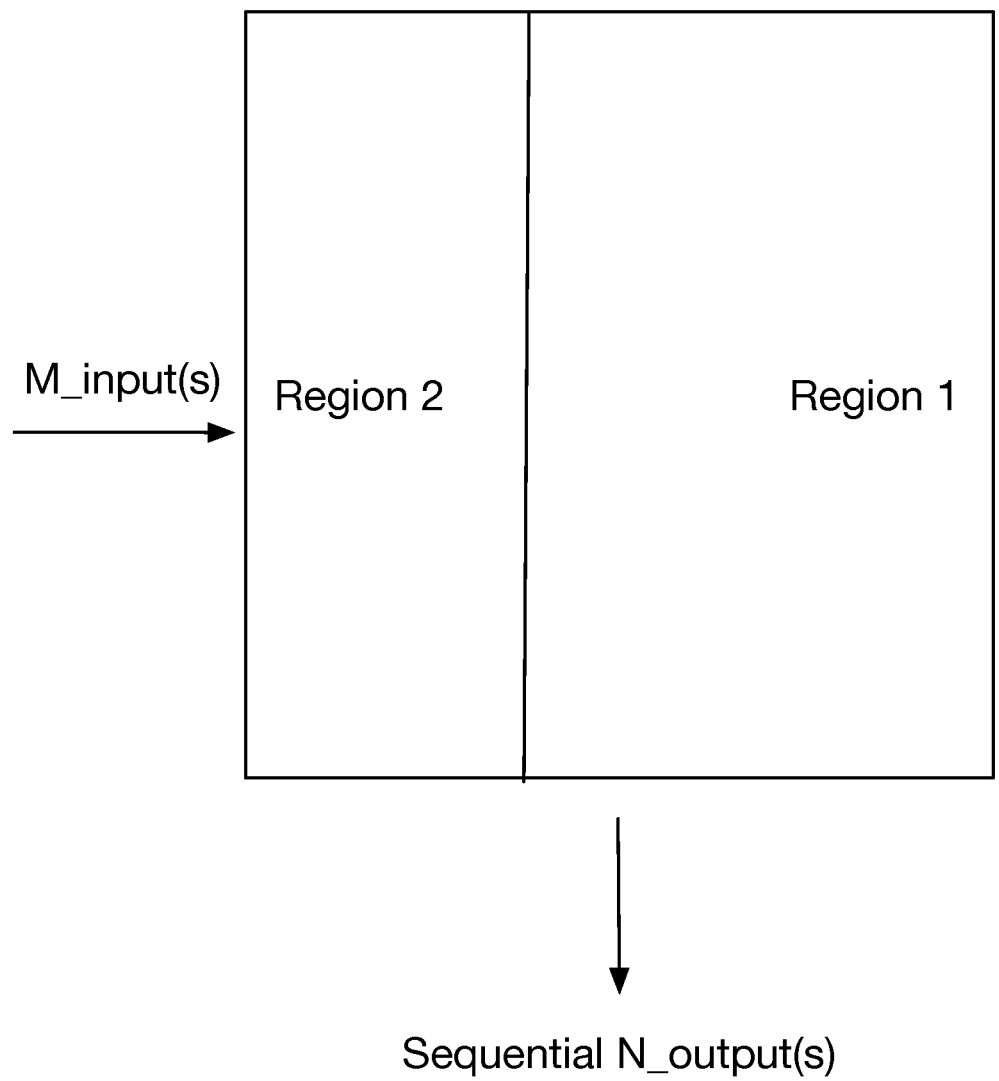
FIG. 4 illustrates a second implementation for mapping a matrix calculation to a matrix multiply accelerator in accordance with one or more embodiments of the present application.

As shown in FIG. 4, a second implementation for mapping matrix calculations to an array of a matrix multiply accelerator of an integrated circuit is provided. In this second implementation, two or more matrix calculations requiring fewer outputs than total output units of a given matrix multiply accelerator may be identified. The matrix coefficients of a first matrix calculation of the two or more matrix calculations may preferably mapped to a first array region of the matrix multiply accelerator. Accordingly, matrix coefficients for a second matrix calculation may be mapped to the unused array region (i.e., the second array region) of the matrix multiply acceleration. The first and the second array regions may be mapped in such a manner that the respective matrix coefficients are mapped extending from a top of the matrix multiply accelerator to a bottom of the matrix multiply accelerator.

In this second implementation, if the first and the second matrix calculations use same matrix input values into the matrix multiply accelerator, then these two disparate matrix calculations may be run in parallel (i.e., at the same time). Thus, when configuring the matrix multiply accelerator with the respective matrix coefficients of the first and second matrix calculations, it may not be necessary to render inactive the unused array portions of the matrix multiply accelerator with respect to the first matrix calculation or the unused array of the matrix multiply accelerator with respect to the second matrix calculation. However, if the first and second matrix calculations use different matrix inputs, then the first and the second matrix calculations may be performed sequentially. In this case, the outputs to the region not being computed can be ignored or made inactive.

As a result of the above configuration, both the first and the second matrix calculations may exist on a same matrix multiply accelerator and, depending on the input values into the matrix multiply accelerator, the first and second matrix calculations may be executed in parallel or sequentially.

It shall be noted that, while only a first and a second matrix calculation are described as capable of being mapped to a same matrix multiply accelerator, the embodiments of the present application should not be limited to these examples, but rather any number of disparate matrix calculations may be mapped to a same matrix multiply accelerator to optimize the matrix input capacity thereof.

3.3 Partition by Diagonal Region

Figure 5:
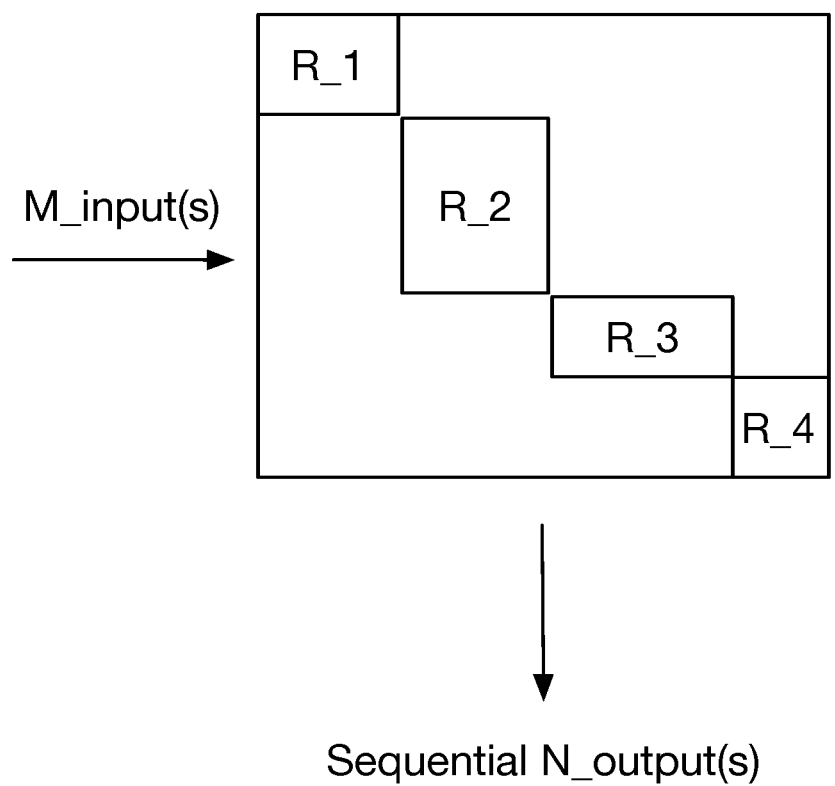
FIGS. 5-5A illustrates a third implementation for mapping a matrix calculation to a matrix multiply accelerator in accordance with one or more embodiments of the present application.

As shown in FIG. 5, a third implementation for mapping multiple matrix calculations to an array of a matrix multiply accelerator of an integrated circuit is provided. In this third implementation, a plurality of matrix calculations may be mapped to a same matrix multiply accelerator based on the matrix inputs for each of the plurality of matrix calculations requiring a combination of too few outputs out of and too few inputs into the matrix multiply accelerator. Specifically, each of the plurality of matrix calculations may be mapped to or segmented into disparate and non-overlapping regions of a same matrix multiply accelerator. In this non-overlapping configuration, the operations of the inputs passing into each of the disparate regions and outputs that are calculated out of the regions are such that they do not interfere with the inputs and/or outputs of other neighboring matrix calculation regions of the same matrix multiply accelerator. Accordingly, an apparent diagonal or stepped configuration is achieved by the placement of the matrix calculation regions along the matrix multiply calculations that allows the inputs of the plurality of disparate matrix calculations into the matrix multiply accelerator to be in made in parallel and similarly, the outputs of each of the plurality of matrix calculations to be output from the matrix multiple accelerator in parallel.

Figure 5A:
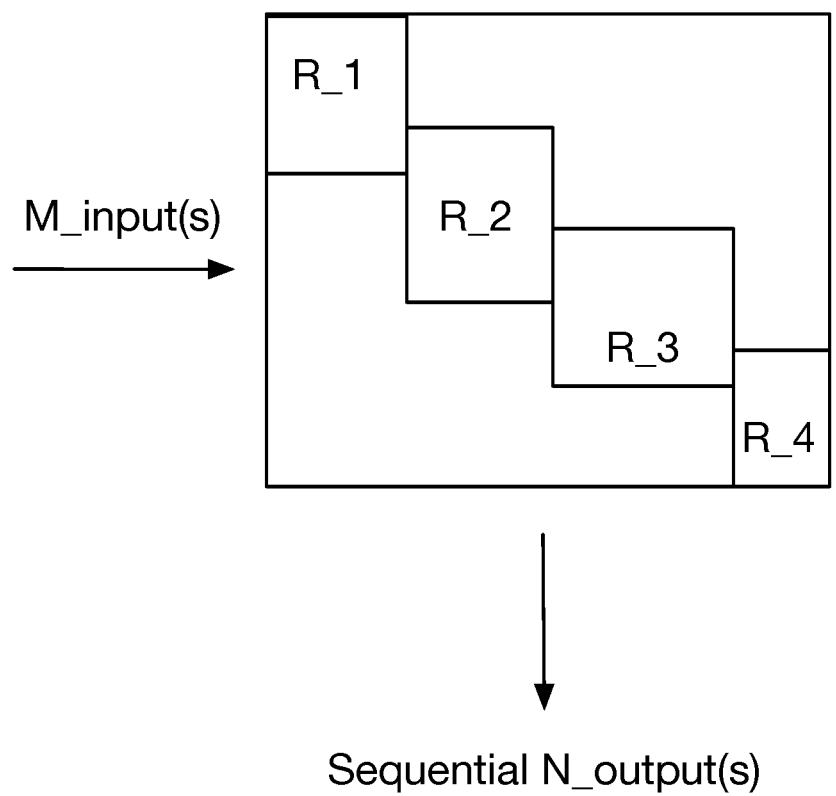

It shall be noted that the partitioning technique described in this third implementation may additionally or alternatively enable the two or more distinct calculation regions within an array of matrix multiply accelerators to receive overlapping inputs, as shown by way of example in FIG. 5A. In this variant of the third implementation, the distinct matrix multiplication regions may have partially shared inputs that can be calculated in parallel by placing zeroes in certain weights (or possibly deactivating certain weights). In use, for instance, multiple distinct matrix multiplication regions may be mapped or arranged in a diagonal manner along a single array of matrix multiply accelerators. In this instance, two or more matrix multiplication regions that may be partially aligned along one or more vector input rows may function to share inputs and to enable parallel execution, zeroes may be added along the array to mask weights in regions outside of the multiple distinct matrix multiplication regions.

The diagonal configuration of the plurality of disparate matrix calculation regions may extend from a first side of the matrix multiply accelerator to a second side of the matrix multiply accelerator. In some embodiments, the diagonal configuration may be optimized such that disparate and non-overlapping matrix calculation regions are continuous across the matrix multiply accelerator. Alternatively, the diagonal configuration of the plurality of non-overlapping matrix calculation regions may be discontinuous across the matrix multiply accelerator.

Accordingly, in the diagonal configuration of the multiple matrix calculation regions, the unused portions or regions of the matrix multiply accelerator may be made inactive thereby enabling an efficient and accurate calculation of only the regions of the matrix multiply accelerator having coefficient inputs of the multiple matrix calculations stored thereon. Since the plurality of matrix calculations are generally in the diagonal configuration, the matrix multiply accelerator may function to execute some or all of the matrix calculations in parallel.

It shall be noted that a size and/or configuration of each of the plurality of matrix calculation regions may vary according to an amount of matrix inputs required for each region.

3.4 Partition by Multiplexer

Figure 6:
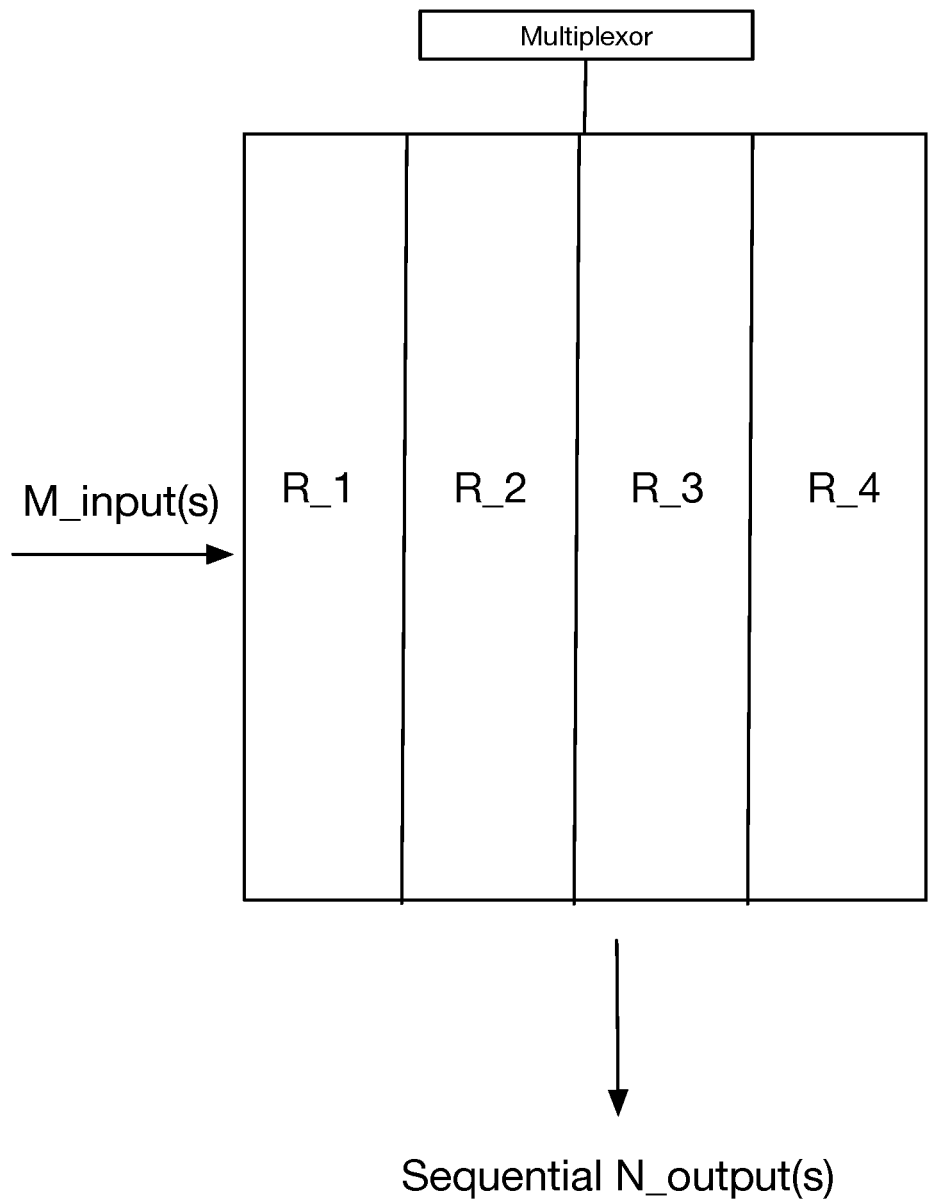
FIG. 6 illustrates a fourth implementation for mapping a matrix calculation to a matrix multiply accelerator in accordance with one or more embodiments of the present application.

As shown in FIG. 6, a fourth implementation for mapping multiple matrix calculations to an array of a matrix multiply accelerator of an integrated circuit is described. According to this fourth implementation, a multiplexer may be implemented that enables a large number of matrix calculations having large inputs but few outputs (e.g., fewer than or equal to the outputs of the MMA) to be mapped to a matrix multiply accelerator. Input requirements for a given matrix calculation may be considered large if the input requirements of the matrix calculation matches the input capacity of the array or if the input requirements of the matrix calculation exceeds a large inputs threshold (e.g., 70-100% of inputs of array are utilized by the calculation, etc.).

Additionally, in some circumstances, mixed-signal computing structures for generating outputs of a matrix multiply accelerator are larger than columns of memory cells of the matrix multiply accelerator. In such circumstances, it may be technically difficult or impractical to implement an output structure of a matrix multiply accelerator in the width of a single memory cell column. Accordingly, the multiplexer, as implemented in this fourth implementation, enables multiple memory cell columns of a matrix multiply accelerator to share a common output circuit (e.g., the multiplexer). Accordingly, a practical and efficient architecture of the output circuitry of a matrix multiply accelerator may be achieved by implementing the multiplexer in this manner.

Specifically, in some embodiments, each of a plurality of matrix calculations having large inputs and relatively small outputs may be mapped in a serial manner across a same matrix multiply accelerator. In this configuration, each of the plurality of matrix calculations may be mapped to extend from a top of the matrix multiply accelerator to a bottom of the matrix multiply accelerator.

The multiplexor may be configured such that each of the mappings for the plurality of matrix calculations is mapped to one of a plurality of settings of the multiplexor. Accordingly, each of the plurality of mapping calculations may be assigned a distinct setting at the multiplexer such that each of the collective mapping calculations may be treated as a set of independent arrays that are preferably serially executed. That is, the multiplexer preferably functions to selectively activate one of the matrix coefficient columns of the matrix multiply accelerator thereby enabling the matrix multiply accelerator to serially perform calculations based on the activated column.

3.5 Partition by Region

Figure 7:
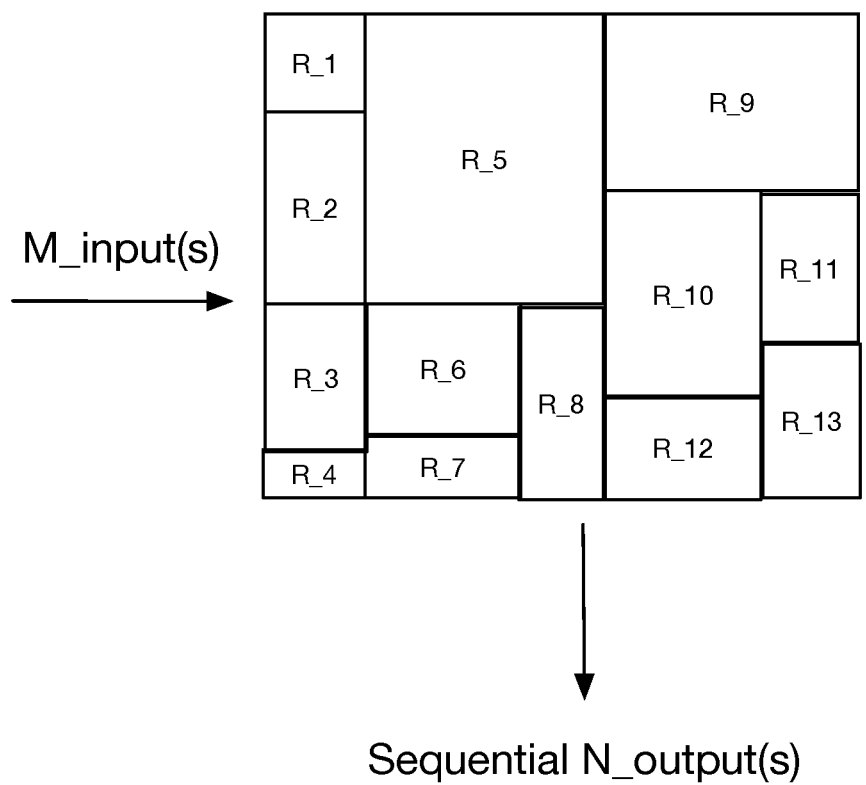
FIG. 7 illustrates a fifth implementation for mapping a matrix calculation to a matrix multiply accelerator in accordance with one or more embodiments of the present application.

As shown in FIG. 7, a fifth implementation for mapping multiple matrix calculations to an array of a matrix multiply accelerator of an integrated circuit is described. In particular, this fifth implementation functions to map to many small arrays of a matrix multiply accelerator a plurality of matrix calculations thereby optimizing a use of a single matrix multiply accelerator.

Specifically, this fifth implementation functions to identify a plurality of distinct matrix calculations that may be reasonably arranged together on a single matrix multiply accelerator. The plurality of distinct matrix calculations may be arranged together in a compact manner or the like to optimize a matrix input capacity (e.g., array coefficient utilization) of a matrix multiply accelerator. In this configuration, regions of the matrix multiply accelerator having the plurality of distinct matrix calculations may overlap along input rows and output columns of the matrix multiply accelerator. That is, while each of the distinct matrix calculations mapped to a specific region of the matrix multiply accelerator, it is possible that the inputs and outputs of a given region overlap the inputs and outputs of another region having a different matrix calculation.

Once each of the plurality of distinct matrix calculations is mapped or arranged within a matrix multiply accelerator, the fifth implementation may preferably function to serially execute each or the plurality of distinct matrix calculations of the matrix multiply accelerator by selecting a region (e.g., a mapped distinct matrix calculation) of the matrix multiply accelerator to activate while deactivating the other regions of the matrix multiply accelerator having other matrix calculations. This enables each of the plurality of distinct matrix calculation inputs to execute without interference from inputs and outputs of the other distinct matrix calculations residing on the matrix multiply accelerator.

3.6 Combined Multiple Arrays or Regions

A sixth implementation for mapping multiple matrix calculations to arrays of matrix multiply accelerators of an integrated circuit is described. In some embodiments, matrix calculations having a large number of inputs and/or large number of outputs exceeding available arrays of a matrix multiply accelerator may be implemented. In such embodiment, two or more matrix multiply accelerators may be used in combination with sufficient available matrix input capacity to store and/or execute the large number of coefficient inputs and/or the large number of outputs of the matrix calculations.

In particular, the sixth implementation functions to partition a large matrix calculation across two or more matrix multiply accelerators. That is, the sixth implementation allocates a portion of the large number of inputs and/or a portion of the large number of outputs of the matrix calculation to a first of the two or more matrix multiply accelerators and another portion of the large number of outputs of the matrix calculation to a second of the two or more matrix multiply accelerators. The sixth implementation may function to allocate the matrix coefficients input across the regions of the two or more matrix multiply accelerators until all matrix coefficient inputs of the matrix calculation are fully distributed or allocated.

In operation, the sixth implementation functions to apply vector input to the two or more matrix multiply accelerators having stored thereon the matrix calculations. The sixth implementation preferably collects the outputs calculated by two or more matrix multiply accelerators based on the vector input and combines the collected outputs of the two or more matrix multiply accelerators. Specifically, the sixth implementation combines the collected outputs of the two or more matrix multiply accelerators using element-wise summation. That is, using element-wise summation, the sixth implementation may combine outputs of the two or more matrix multiply accelerators by summing together one or more regions of disparate accelerators of the two or more matrix multiply accelerators. For example, matrix coefficient inputs (e.g., weights and/or coefficients of an algorithm) of a single matrix calculation may be mapped to two matrix multiply accelerators. In such example, if a vector input is applied to the two matrix multiply accelerators, the output of the two matrix multiply accelerators may be collected and summed together using element-wise summation. More specifically, output of a first column of a first matrix multiply accelerator of the two matrix multiply accelerators may be summed with output of a first column of a second matrix multiply accelerator of the two matrix multiply accelerators. Alternatively, output of a first region of a first matrix multiply accelerator of the two matrix multiply accelerators may be summed with a first region of a second matrix multiply accelerator of the two matrix multiply accelerators. Additionally, or alternatively, a summation of the outputs from the two or more matrix multiply accelerators may be achieved using a single instruction multiple data (SIMD) unit (alternatively, using a shared arithmetic logic unit) to reduce sum of the output of the two or more matrix multiply accelerators. For instance, if a single matrix calculation maps to five distinct arrays of matrix multiply accelerators, then a reduce sum of the outputs of the five distinct arrays of matrix multiply accelerators may be performed at one SIMD.

Accordingly, outputs of the two or more matrix multiply accelerators may be summed in any suitable manner that allows appropriate regions of two or more matrix multiply accelerators to be summed together to produce a same collective output as if the matrix calculation input were implemented using a same or single matrix multiply accelerator.

Additionally, or alternatively, in the circumstance that the inputs of a matrix calculation exceeds a matrix input capacity of a single array of matrix multiply accelerators but a number of the inputs of the matrix calculation use or recycle common coefficients or weights, this sixth implementation may be varied to enable multiple multiplexor settings for processing the inputs of the matrix calculation with a single array of matrix multiply accelerators. For instance, if the matrix multiple accelerator has 1024 inputs but the matrix calculation requires 2000 inputs, then a single matrix multiple accelerator can be implemented with two multiplexer settings to receive all of the inputs (in sequence) and combine the resultant product of the calculations either in the matrix multiple accelerator, itself, or outside of the matrix multiple accelerator.

3.7 Negative Logical Inputs from Positive Physical Inputs

A system and/or method for mapping a matrix calculation to an array of a matrix multiply accelerator of an integrated circuit is described. Preferably, a method for mapping the matrix calculation includes configuring a matrix multiply accelerator that may function to accept only positive matrix coefficient or weight input values to accept and/or produce negative logical inputs. That is, in some embodiments, matrix multiply accelerators may not be functionally capable of accepting a negative matrix input within their matrix input units of the array of matrix multiple accelerators. Because of this limitation of typical matrix multiply accelerators, some embodiments of the present application function to reconfigure typical matrix multiply accelerators to accept negative logical inputs thereby enabling the mapping of a matrix calculation requiring negative inputs.

Configuring the matrix multiply accelerator may include mapping a matrix calculation that requires negative matrix inputs to arrays of the matrix multiply accelerator by enabling the matrix inputs (e.g., the weights or coefficients) at one or more matrix input locations of a matrix multiply accelerator to include negative matrix inputs (or negative coefficients/weights, etc.). Specifically, the method functions to split or partition a coefficient across two lines of a matrix array of the matrix multiply accelerator. In a first of the two lines may include a positive line that enables a recognition of a positive input based on an input signal received at the matrix multiply accelerator. In a second of the two lines may include a negative line that enables a recognition of a negative input based on an input signal received at the matrix multiply accelerator. Preferably, each of the first and the second line may be conditionally activated based on a sign of the input signal into the matrix multiply accelerator.

Figure 8:
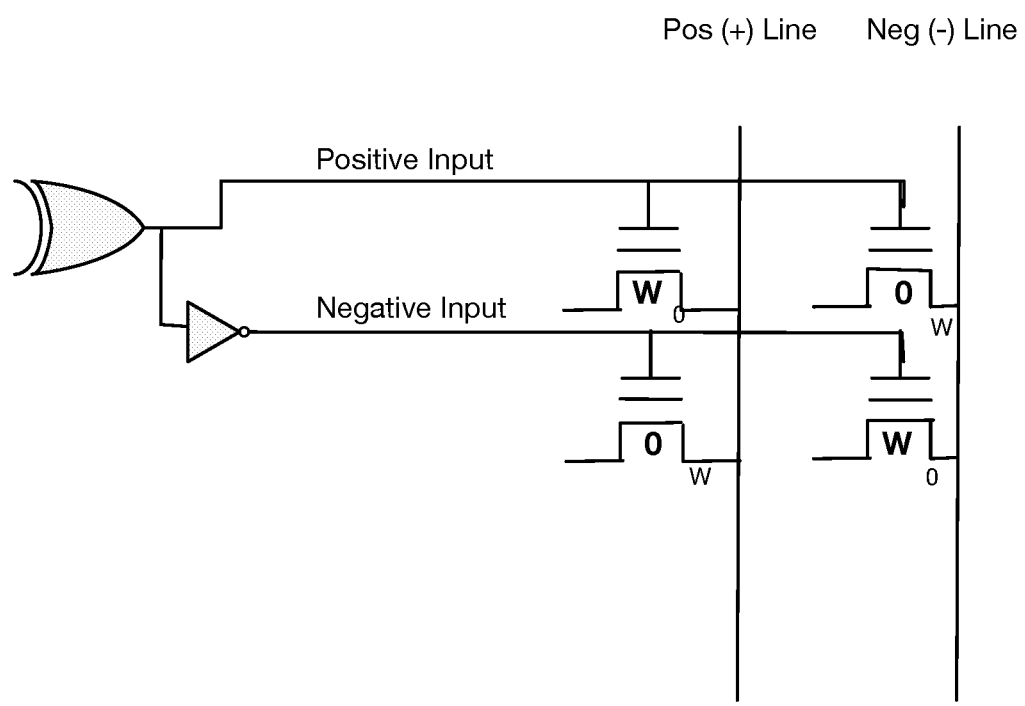
FIG. 8 illustrates a further implementation for mapping a matrix calculation to a matrix multiply accelerator in accordance with one or more embodiments of the present application.

In one implementation, as shown by way of example in FIG. 8, when a signal of input into the matrix multiply accelerator is positive, the system is configured to pass the input along the top line (or positive line) and when a signal of input into the matrix multiply accelerator is positive, the system is configured to passed the input along the bottom line (or negative line). Accordingly, the system may include a comparator or other component that functions to determine a sign of the input signal. That is, the comparator of the like may function to determine whether the input value is positive or negative.

Once it is determined whether a sign of the input into the matrix multiply accelerator is positive or negative, the method functions to selectively activate one of two inputs (e.g., the positive coefficient or the negative coefficient) at the matrix input location of the matrix multiply accelerator. Preferably, a logic device, such as an XOR gate, may function to provide a conditional inversion for a binary input. In one variation implementing a multi-bit input, a system implementing the method may function to use a two-complement inversion in combination with a de-multiplexer to provide the conditional inversion for the multi-bit binary input.

3.8 Multi-Row Input

An eighth implementation for mapping a matrix calculations to an array of a matrix multiply accelerator of an integrated circuit is described. In some embodiments, an input vector into a matrix multiply accelerator may include more bits per vector element than bits per input element of the matrix multiply accelerator. For instance, each input vector element may be eight bits whereas each element of the matrix multiply accelerator may be three bits. Thus, the matrix multiply accelerator may not have sufficient bits per element to successfully perform the calculations against the input vector having greater bits per element. Additionally, in some embodiments, to achieve improved technical performance in processing calculations by an array of matrix multiply accelerators, splitting or spreading the bits of an input vector may enable computation efficiencies by reducing the computational load at a given matrix input location. For instance, by splitting bits of an input vector into two halves with each half being computed by a distinct matrix input location of an array, the input vector may be computed approximately twice as fast since the computational workload is distributed to multiple computationally capable calculation units within the array. Even further performance efficiencies may be achieved by spreading the bits of a single input vector among a greater number of matrix input locations of an array. Additionally, the array of matrix multiple accelerators may also provide energy performance efficiencies resulting from a lesser computation runtime of the array.

In some embodiments, because a number of input and output rows of a given matrix multiply accelerator may be fixed, it may be necessary to shift coefficients along the matrix multiply accelerator to enable computation of an input vector having greater bits per element. According to this eighth implementation, bits of the input vector may be presented on different rows (e.g., inputs) of the matrix multiply accelerator. To accomplish this, the coefficient values of the matrix multiply accelerator may be shifted onto the different rows before loading the input vector onto the matrix multiply accelerator.

Figure 9:
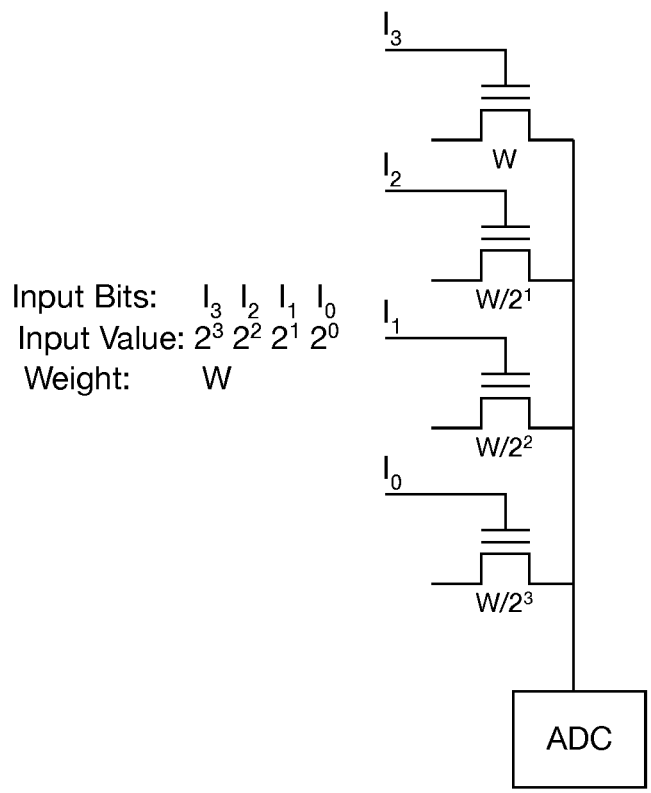
FIG. 9 illustrates yet a further implementation for mapping a matrix calculation to a matrix multiply accelerator in accordance with one or more embodiments of the present application.

As shown by way of example in FIG. 9, the multi-row input of an input vector may be implemented such that the multiple rows of the matrix multiply accelerator can perform calculations of one bit or two bits (or any suitable number of bits). In a multi-row one-bit implementation, each input bit of the input vector is presented on a different row of the matrix multiply accelerator. Regarding a multi-row two-bit implementation, two successive bits of an input vector are presented on each row of the matrix multiply accelerator. In these implementations, a coefficient value of the matrix multiply accelerator is duplicated or shifted along a number of different rows sufficiently to calculate a product based on the input vector.

The bits may be spread in any suitable manner including as described in the following examples. In a first example, when two inputs may be used to represent an 8-bit input (e.g., 7, 6, 5, 4, 3, 2, 1, 0), the input bits maybe splits as follows: 7, 6, 5, 4, for the first input and 3, 2, 1, 0 for the second input. In such first example, the weights or coefficients may be W for the first input, and $w/2^4$ for the second input. Alternatively, in a second example, when two inputs may be used to represent an 8-bit input (e.g., 7, 6, 5, 4, 3, 2, 1, 0), the input bits maybe splits as follows: 7, 5, 3, 1 for the first input and 6, 4, 2, 0 for the second input. Implementing the bit spreading as shown in the second example may operate to yield more accurate results.

3.9 Multi-Step Input

Additionally, or alternatively, a ninth implementation for mapping a matrix calculation to an array of a matrix multiply accelerator of an integrated circuit is described. As discussed in above section 3.8, in some instances, an input vector into a matrix multiply accelerator may include more bits per vector element than bits per input element of the matrix multiply accelerator.

According to this ninth implementation, the input vector bits may be partitioned over multiple matrix calculations in a serial or stepped fashion. The resulting outputs may be summed together to generate a final output. In such implementation, the outputs of the multiple calculations are shifted into alignment prior to summing the output values. Alternatively, the accumulation registers may be shifted before adding new output values from the multiple calculations.

Additionally, in the circumstance that the matrix calculation inputs of the matrix multiply accelerator are time-domain multiplexed, the input vector bits may be presented to the matrix multiply accelerator and the matrix multiply accelerator may function to perform a calculation. The output of the calculation of the matrix multiply accelerator may be held or stored external to the matrix multiply accelerator until a summation process is implemented. Subsequently, another or successive set of input vector bits may be presented for calculations at the matrix multiply accelerator. Once calculations are performed by the successive set of inputs vector bits, the output can be shifted and added to the previous output results of the initial calculation of the matrix multiply accelerator.

It shall be understood that the methods described herein are exemplary methods that may be implemented in any suitable order to achieve the inventions and/or embodiments of the inventions within the purview or that may be easily contemplated in view of the disclosure provided herein. Thus, the order and process steps should not be limited to the exemplary order provided herein. Additionally, or alternatively, the methods, processes, techniques, and/or systems described herein may be performed in any suitable combination to achieve additional and/or enhance performance efficiencies of an integrated circuit.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. A method of configuring an array of matrix multiply accelerators of an integrated circuit with coefficients of one or more computationally-intensive applications, the method comprising:

identifying a utilization constraint type of the array of matrix multiply accelerators from a plurality of distinct utilization constraint types based on computing attributes of the one or more computationally-intensive applications;

identifying at least one coefficient mapping technique from a plurality of distinct coefficient mapping techniques that addresses the utilization constraint type;

configuring the array of matrix multiply accelerators according to the at least one coefficient mapping technique, wherein configuring the array includes at least setting within the array the coefficients of the one or more computationally-intensive applications in an arrangement prescribed by the at least one coefficient mapping technique that optimizes a computational utilization of the array of matrix multiply accelerators, and wherein if a computation of at least two of the one or more computationally-intensive applications in combination require fewer inputs and fewer outputs than a matrix input capacity and a matrix output capacity, respectively, of the array of matrix multiply accelerators, the at least one coefficient mapping technique includes partitioning the array of matrix multiply accelerators to:

map coefficients of a first application of the one or more computationally-intensive applications to a first region of the array; and map coefficients of a second application of the one or more computationally-intensive applications to a second region of the array, wherein the first region and the second region of the array have partially overlapping input regions and have uncommon output ports.

2. The method according to claim 1, further comprising:

identifying at least one input/output handling technique based on the utilization constraint type; and configuring a multiplexor associated with the array of matrix multiply accelerators based on the at least one input/output handling technique.

3. The method according to claim 1, wherein if a computation of at least one of the one or more computationally-intensive applications requires fewer inputs than a matrix coefficient input capacity of the array of matrix multiply accelerators, the at least one coefficient mapping technique includes partitioning the array of matrix multiply accelerators to:

map coefficients of a first application of the one or more computationally-intensive applications to a first region of the array; and map coefficients of a second application of the one or more computationally-intensive applications to a second region of the array, wherein the first region and the second region of the array are non-overlapping regions and each have uncommon input ports.

4. The method according to claim 3, further comprising:
at runtime, executing one of the first region and the second region while deactivating one of the first region and the second region that is not executed.

5. The method according to claim 1, wherein
if a computation of at least one of the one or more computationally-intensive applications requires fewer outputs than a matrix output capacity of the array of matrix multiply accelerators, the at least one coefficient mapping technique includes partitioning the array of matrix multiply accelerators to:
map coefficients of a first application of the one or more computationally-intensive applications to a first region of the array; and
map coefficients of a second application of the one or more computationally-intensive applications to a second region of the array, wherein the first region and the second region of the array are non-overlapping regions and each have uncommon output ports.

6. The method according to claim 5, further comprising:
at runtime, executing one of the first region and the second region while deactivating one of the first region and the second region that is not executed.

7. The method according to claim 1, wherein
if a computation of at least two of the one or more computationally-intensive applications in combination require fewer inputs and fewer outputs than a matrix input capacity and a matrix output capacity, respectively, of the array of matrix multiply accelerators, the at least one coefficient mapping technique includes partitioning the array of matrix multiply accelerators to:
map coefficients of a first application of the one or more computationally-intensive applications to a first region of the array; and
map coefficients of a second application of the one or more computationally-intensive applications to a second region of the array, wherein the first region and the second region of the array are non-overlapping regions and each have uncommon input ports and uncommon output ports.

8. The method according to claim 7, further comprising:
at runtime, executing each of the first region and the second region in parallel.

9. The method according to claim 1, wherein
at runtime, executing one of the first region and the second region while deactivating one of the first region and the second region that is not executed.

10. The method according to claim 2, wherein
if each of multiple distinct applications of the one or more computationally-intensive applications require large inputs that exceed an inputs threshold and each have fewer outputs below an outputs threshold:
the at least one coefficient mapping technique includes partitioning the array of matrix multiply accelerators to:
map coefficients of each of the multiple distinct applications to multiple distinct regions of the array such that the coefficients of each of the multiple distinct applications are arranged in parallel and each of the multiple distinct regions are arranged along uncommon output ports; and
the at least one input/output handling technique includes setting the multiplexor to serially output computation results of each of the multiple distinct applications via a common output circuit.

11. The method according to claim 1, wherein
if a computation of multiple distinct applications of the one or more computationally-intensive applications in combination require fewer inputs and fewer outputs than a matrix input capacity and a matrix output capacity of the array of matrix multiply accelerators, the at least one coefficient mapping technique includes partitioning the array of matrix multiply accelerators to:
map coefficients of each of the multiple distinct applications of the one or more computationally-intensive applications to a plurality of distinct regions of the array, wherein the plurality of distinct regions include distinct regions having overlapping input ports and overlapping output ports;
the method further comprises:
serially executing each of the plurality of distinct regions of the array by selecting one of the plurality of distinct regions for active execution and disabling an execution of remaining distinct regions of the plurality of distinct regions.

12. The method according to claim 1, wherein
if a computation of at least one of the one or more computationally-intensive applications requires greater inputs than a matrix input capacity and/or greater outputs than a matrix output capacity of the array of matrix multiply accelerators, the at least one coefficient mapping technique includes:
partitioning coefficients of the at least one computationally-intensive application to multiple distinct arrays of matrix multiply accelerators;
the method further comprises:
applying an input vector to each of the multiple distinct arrays of matrix multiply accelerators;
collecting outputs computed by each of the multiple distinct arrays of matrix multiply accelerators; and
combining the outputs of the multiple distinct arrays of matrix multiply accelerators.

13. The method according to claim 1, further comprising:
configuring the array of matrix multiply accelerators to produce positive outputs and produce negative logical outputs based on input signals into the array includes:
configuring one or more matrix coefficient input locations within the array with a positive line that passes an input signal with a positive sign and a negative line that passes an input signal with a negative sign; and
setting a matrix coefficient along each of the positive line and the negative line of the one or more matrix coefficient input locations.

14. The method according to claim 1, wherein
if an input vector into the array of matrix multiply accelerators includes a greater bit-size than a bit-size of a matrix coefficient input location within the array, the at least one coefficient mapping technique includes:
prior to receiving bits of an input vector having oversized input bits, shifting coefficients of an undersized matrix coefficient input location to multiple rows of the array,
the method further comprising:
at runtime, spreading bits of the input vector over the multiple rows of the array; and
summing outputs of the multiple rows of the array that share a common coefficient value.

15. The method according to claim 2, wherein
if input vector into the array of matrix multiply accelerators includes a greater bit-size than a bit-size of a matrix coefficient input location within the array, the at least one input/output handling technique includes:
partitioning bits of the input vector having oversized input bits over multiple calculations of the array in a serial manner or stepped fashion;
the method further comprising:
shifting outputs of the multiple calculations of the array into an alignment prior to summing output values of the multiple calculations.

16. The method according to claim 1, wherein
the one or more computationally-intensive applications comprise one or more distinct machine learning applications.

17. A method of configuring an array of matrix multiply accelerators of an integrated circuit with coefficients of one or more computationally-intensive applications, the method comprising:
identifying a utilization constraint type of the array of matrix multiply accelerators from a plurality of distinct utilization constraint types based on computing attributes of the one or more computationally-intensive applications;
identifying at least one coefficient mapping technique from a plurality of distinct coefficient mapping techniques that addresses the utilization constraint type;
configuring the array of matrix multiply accelerators according to the at least one coefficient mapping technique, wherein configuring the array includes at least setting within the array the coefficients of the one or more computationally-intensive applications in an arrangement prescribed by the at least one coefficient mapping technique that optimizes a computational utilization of the array of matrix multiply accelerators;
identifying at least one input/output handling technique based on the utilization constraint type; and
configuring a multiplexor associated with the array of matrix multiply accelerators based on the at least one input/output handling technique,
wherein if each of multiple distinct applications of the one or more computationally-intensive applications require large inputs that exceed an inputs threshold and each have fewer outputs below an outputs threshold:
the at least one coefficient mapping technique includes partitioning the array of matrix multiply accelerators to:
map coefficients of each of the multiple distinct applications to multiple distinct regions of the array such that the coefficients of each of the multiple distinct applications are arranged in parallel and each of the multiple distinct regions are arranged along uncommon output ports; and
the at least one input/output handling technique includes setting the multiplexor to serially output computation results of each of the multiple distinct applications via a common output circuit.

18. The method according to claim 17, wherein
the one or more computationally-intensive applications comprise one or more distinct machine learning applications.

19. A method of configuring an array of matrix multiply accelerators of an integrated circuit with coefficients of one or more computationally-intensive applications, the method comprising:
identifying a utilization constraint type of the array of matrix multiply accelerators from a plurality of distinct utilization constraint types based on computing attributes of the one or more computationally-intensive applications;
identifying at least one coefficient mapping technique from a plurality of distinct coefficient mapping techniques that addresses the utilization constraint type;
configuring the array of matrix multiply accelerators according to the at least one coefficient mapping technique, wherein configuring the array includes at least setting within the array the coefficients of the one or more computationally-intensive applications in an arrangement prescribed by the at least one coefficient mapping technique that optimizes a computational utilization of the array of matrix multiply accelerators, and
wherein if a computation of multiple distinct applications of the one or more computationally-intensive applications in combination require fewer inputs and fewer outputs than a matrix input capacity and a matrix output capacity of the array of matrix multiply accelerators, the at least one coefficient mapping technique includes partitioning the array of matrix multiply accelerators to:
map coefficients of each of the multiple distinct applications of the one or more computationally-intensive applications to a plurality of distinct regions of the array, wherein the plurality of distinct regions include distinct regions having overlapping input ports and overlapping output ports;
the method further comprises:
serially executing each of the plurality of distinct regions of the array by selecting one of the plurality of distinct regions for active execution and disabling an execution of remaining distinct regions of the plurality of distinct regions.

20. The method according to claim 19, wherein
the one or more computationally-intensive applications comprise one or more distinct machine learning applications.

* * * * *